United States Patent
Matsuki et al.

(10) Patent No.: US 6,232,147 B1
(45) Date of Patent: May 15, 2001

(54) METHOD FOR MANUFACTURING SEMICONDUCTOR DEVICE WITH PAD STRUCTURE

(75) Inventors: Hirohisa Matsuki; Kenichi Kado; Eiji Watanabe; Kazuyuki Imamura; Takahiro Yurino, all of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/365,413

(22) Filed: Aug. 2, 1999

Related U.S. Application Data

(62) Division of application No. 08/999,115, filed on Dec. 29, 1997, now Pat. No. 5,969,424.

(30) Foreign Application Priority Data

Mar. 19, 1997 (JP) .................................................. 9-065778
Oct. 21, 1997 (JP) .................................................. 9-288590

(51) Int. Cl.[7] ........................ H01L 21/44; H01L 21/48; H01L 21/50
(52) U.S. Cl. ........................ 438/108; 438/612; 438/613
(58) Field of Search .................................. 438/106, 108, 438/612, 613

(56) References Cited

U.S. PATENT DOCUMENTS

| | | |
|---|---|---|
| 4,427,715 * | 1/1984 | Harris . |
| 5,134,460 | 7/1992 | Brady . |
| 5,272,376 | 12/1993 | Ueno . |
| 5,668,405 | 9/1997 | Yamashita et al. . |
| 5,810,607 * | 9/1998 | Shih et al. . |

FOREIGN PATENT DOCUMENTS

| | | |
|---|---|---|
| 57-122542 | 7/1982 | (JP) . |
| 60-136339 | 7/1985 | (JP) . |
| 62-183134 | 8/1987 | (JP) . |
| 1-290232 | 11/1989 | (JP) . |
| 2-121333 | 5/1990 | (JP) . |
| 5-36754 | 2/1993 | (JP) . |

* cited by examiner

Primary Examiner—Kevin M. Picardat
Assistant Examiner—D. M. Collins
(74) Attorney, Agent, or Firm—Armstrong, Westerman, Hattori, McLeland & Naughton, LLP

(57) ABSTRACT

A semiconductor device equipped with secondary pads having adequate arrangement for an arbitrary packaging process. The secondary pads are connected with the primary pads of the semiconductor device with a novel lead wire structure, which is characterized by its low electric resistance, good mechanical strength to protect active components of the device, good adhesion to bumps, and anti-electromigration property. The semiconductor device has: semiconductor circuit elements 2 embedded in a semiconductor substrate 1; a plurality of conductive primary pads 4 each formed in a region above, and surrounding, the circuit element 2; a first protective insulation substrate 5 covering the substrate and having first openings 6 for the primary pads 4; lead wires 7 each consisting of a conductive bulk layer 15 made of copper and a metallic top layer 16, the bulk layer formed on the first protective insulation substrate 5 and having one end connected with a corresponding one of the primary pads 4 through an associated opening 6 and the other end located in a region surrounding the opening 6, while the top layer made of a metal having Vickers hardness of more than 100; and a second protective insulation substrate 8 having second openings 9 for exposing the top surfaces of the other ends of the lead wires 7 serving as the secondary pads 17.

11 Claims, 11 Drawing Sheets

METHOD FOR MANUFACTURING SEMICONDUCTOR DEVICE WITH PAD STRUCTURE

This application is a division of prior application Ser. No. 08/999,115, filed Dec. 29, 1997 now U.S. Pat. No. 5,969,424.

TECHNICAL FIELD

This invention relates to a reliable semiconductor device and a method of manufacturing such semiconductor device. In one mode, the invention relates to a semiconductor device and in particular to a semiconductor device having a structure that permits rearrangement of pads for connecting semiconductor chips, and a method for manufacturing such semiconductor device. In the other mode, the invention relates to a semiconductor device whose semiconductor chip or chips may be mounted on a printed circuit board by means of an area array bump structure which has a multiplicity of solder bumps in the form of grid.

BACKGROUND OF THE INVENTION

The first mode of the invention will be now described.

In manufacturing electronic devices, wire bonding technology has been utilized in packaging an LSI chip or chips on a semiconductor substrate. The electronic devices are provided with pads for electrical connection of the devices with external lead wires which are made of a material containing aluminum as a major composition. So-called tape Automated Bonding (TAB) technology and Flip Chip technology are also used in packaging LSIs. All of these techniques commonly utilize bumped electrodes which are formed on the pads.

It is noted that these pads must be positioned in an adequate arrangement suitable not only for a design of the LSI but also for a particular bonding technique used, since the arrangement of such pads generally depends on the type of the packaging technology used.

This implies that even those LSI chips having an identical basic structure and identical functions must be packaged in different ways if they are packaged by different techniques. They would then require different packaging designs and additional product management as if they were different LSIs. This would in turn add undesirable complexity and increased cost to the management of the products, thereby rendering the final LSIs costly.

Accordingly, it would be advantageous to provide chips that may be equally packaged by different types of packaging techniques, thereby unaffected by the disadvantages mentioned above.

One way to achieve this feature is disclosed in Japanese Patent Publication Laid Open Nos. 2-121333 and 5-218042, in which the chip is provided with primary pads at positions independent of packaging techniques, and the pads are rearranged in accordance with the packaging technique employed.

Briefly, the pad rearrangement techniques as disclosed in the foregoing patents are based on the formula in which lead wires are formed on a protective insulation substrate having openings or through-holes for primary pads, and additional or secondary pads are mounted on the lead wires extending between the primary pads and secondary pad sites away from the primary pads, so that external lead wires may be connected to the secondary pads at arbitrary positions.

Briefly, these pad rearrangement techniques are based on the formula that additional pads or secondary pads are mounted on lead wires at arbitrary positions away from the original pads so that external lead wires may be connected at those arbitrary positions. These secondary pads are formed on a protective insulation substrate laid on the substrate and having openings for the primary pads.

In the prior art techniques mentioned above, the lead wires have a multi-layered lead structure, which consists of, for example, three layers of titanium (Ti), nickel (Ni), and gold (Au), or two layers of titanium and copper (Cu), deposited in the order mentioned.

Similar prior art techniques for multi-layered lead wires have been also disclosed in Japanese Patent Publication Laid Open Nos. 60-136339, 57-122542, 62-183134, and 1-290232.

The first of these publication concerns with Ti—Cu—Ni layers; the second with Ti—Cu—Ti layers; the third with Ti—Pd—Ti layers; and the last with Al—V—Al layers and Al—Ti—Al layers.

It should be kept in mind, however, that the secondary pads must be necessarily located at sites above the corresponding active semiconductor circuit element (or active component), and hence that the active component must be protected from the weight of the pads plus the bonding load acting on the active component during bonding of the external lead wires onto the secondary pads.

It should be also kept in mind that the sheet resistance of the lead wires must be sufficiently low, since otherwise the lead wires acquire high resistance due to the fact that the secondary pads must be properly spaced apart from their primary pads, so that the lead wires extending between them can be long.

Further, it should be noted that the secondary pads must have good adhesive power to bumps to be formed on the pads.

Still further, the rearrangement structure of the lead wires for the secondary pads must have a structure that may prevent electromigration between them, especially in the case where the chip density of the LSI is increased and accordingly the spacing between the lead wires is decreased. Particularly, the lead wires containing Cu, Au or Ag must have a structure immune to such electromigration.

However, any of the prior art lead wire structures can not satisfy these requirements altogether. There is accordingly a need for a semiconductor device having a novel lead wire structure which meets all the requirements.

The second mode of the invention will be now described.

There have been known many types of techniques for mounting semiconductor chips or electronic devices such as LSIs on a printed circuit board. Choice of an appropriate technique depends on the particular terminal arrangement of the electronic devices to be mounted.

A well known terminal arrangement for electronic devices like LSIs is a peripheral type terminal arrangement, in which terminals extend outwardly from the periphery of the package. A typical example of this type is a quad flat package (QFP).

However, in order to meet a recent requirement for miniaturization of electronic devices and for high density packaging thereof, a mounting technique utilizing so called "face down" solder bumps has been frequently used because these bumps permit of external connection of the terminals and occupy a relatively small mounting area. The solder bumps are mounted on bump lands or terminals provided on an insulation layer. Thus, each of the bump lands needs a predetermined area. Now that an electronic device such as LSI has a very large number of gates, it necessarily has many input and output terminals. Therefore, the electronic device is mounted using a bump grid array in which the bump lands are arranged in the form of generally planar grid in order to arrange many bump lands neatly on the insulation layer. This type of bump structure is also called area array bump structure.

An example of such area array bump structure is shown in FIG. 6A, which shows in a partial side elevational cross section a major portion of a semiconductor device having a conventional solder bump structure. Formed together with various bonding pads and lines on an insulation substrate 52 of a material such as polyimide, is a plurality of bump lands 53 for mounting thereon solder bumps.

A semiconductor chip such as LSI (not shown) is die-bonded at a predetermined position on the top surface of the insulating material 52, using appropriate glue.

The terminals of the semiconductor chip and the bonding pads (not shown) formed on the insulation substrate 52 are electrically connected as needed by means of, for example, an appropriate wire bonding technology. In order to increase the reliability of the electronic device, it is coated with a sealing resin 51.

Each of the bump land 53 is provided with a small through-hole or opening 55 formed in the insulation substrate 52, which is smaller in area compared to the bump land 53. Solder bumps 54 are bonded on the bump lands 53 in the respective openings 55 by overturning the insulation substrate 52, placing the solder bumps 54 in the respective through-holes 55, and applying solder re-flow treatment.

The diameter of each through-hole is constant throughout the thickness of the insulation substrate 52. Thus, the configuration of the through-holes for accommodating the solder bumps 54 is generally cylindrical. That portion of the solder over-flown out of each through-hole has a generally round shape due to the surface tension. This is how solder bumps are formed in packaging a semiconductor device.

In conventional packaging methods using an area array bump structure as mentioned above, connection failures can happen when and after a semiconductor device is bonded to a printed circuit board and installed further in an electronic equipment.

The inventors of the present invention have examined many of such connection failures associated with the area array bump structures and have found that most of the connection failures are caused by the exfoliation (indicated by reference number 42) of the solder bump lands 53 of the semiconductor devices from the solder bumps 54 as shown in FIG. 6B.

The inventors have found that such exfoliation of the bump lands 53 from the solder bumps 54 is caused by an excessive external stress that arises from handling of the semiconductor device or the printed circuit board 61, installing the printed circuit board 61 to the electronic equipment, and mismatching of thermal expansions of the insulation layer 52 accommodating the bumps and the printed circuit board 61, and that concentrate in the bonding interfaces between the solder bumps 54 and the bump lands 53.

The inventors have reached a conclusion that such exfoliation of the bump lands 53 and the solder bumps 54 can be avoided if the solder bumps are provided with mechanically weak portions that may deform to absorb the external stresses. The invention is based on this principle.

It might seem a common practice to make the initial configuration of the solder bumps in the through-holes in any desired form, for example a straight cylindrical shape, a barrel shape having a diametrically larger middle section, or a "bongo" shape having a diametrically smaller middle section, in accord with the configuration of the through-holes formed in the insulation substrate. It should be appreciated, however, that positive provision of the bump configuration having such mechanically weak portions is based on a novel and useful findings of the inventors, which is useful in avoiding the exfoliation of the solder bumps by concentrating external stresses at the weak portions of the solder bumps, thereby absorbing such stresses applied to the printed circuit board and the semiconductor devices during and after mounting the semiconductor devices on the printed circuit board.

SUMMARY OF THE INVENTION

In accordance with one aspect of the present invention, there is provided a semiconductor device comprising:

a semiconductor circuit element (2);

a plurality of conductive primary pads (4) formed in a region above and surrounding the semiconductor circuit element (2);

a first protective insulation substrate (5) for covering the plurality of primary pads (4), the protective insulation substrate (5) having a first opening (6) for exposing each of the pads (4);

a plurality of lead wires (7) each including a conductive bulk layer (15) of copper which extends on the first protective insulation substrate (5) and has one end portion bonded to one of the pads (4) through the opening (6) and the other end portion extending to a region of the insulation substrate (5) surrounding the opening (6), and including a top layer (16) made of platinum or a platinum alloy, on top of the conductive bulk layer; and a second protective insulation substrate (8) having an opening (9) formed for exposing the top layer of the other end portion of the lead wire, the exposed other end portion serving as a second conductive pad (17).

In another aspect of the invention, there is provided a method for manufacturing a semiconductor device, comprising steps of:

forming a plurality of conductive primary pads (4) for a semiconductor circuit element (2) prepared on a semiconductor substrate (1) such that the pads are located in a region above and surrounding the semiconductor circuit element (2);

forming a first protective insulation substrate(5) covering the plurality of primary pads (4);

forming in the first protective insulation substrate (5) an opening (6) for exposing each of the pads (4);

forming a resist (14) having a window (14*a*) in the form of (stripe) elongate groove extending from, and to a region surrounding the opening (6), and across the opening (6);

forming within the window (14*a*) a conductive bulk layer (13) for a lead wire (7) connected at one end thereof to the pad (4) in the opening (6);

forming a third metallic layer of a hard metal on each of the conductive bulk layer (13);

removing the resist (14);

forming a second protective insulation substrate (8) for covering the first protective insulation substrate (5) and the lead wires (7); and forming a second opening (9) in the second protective insulation substrate (8), for exposing the top surface of the other end of the lead wire as a secondary conductive pad (17).

Some of the features of the invention are as follows.

First, a semiconductor device has secondary pads. The lead wire connecting each of the primary pads to a corresponding secondary pad has a conductive bulk layer made of copper, and a top conductive layer overlying the bulk layer made of a hard metal such as platinum alloy. The end section of the top layer serves as the secondary pad.

It would be appreciated that the top layer of the lead wire, serving as the secondary pad, is hard enough not to be deformed by the external force or load applied thereto during TAB or any other wire bonding. The hard top layer thus disperses the external load through the entire hard layer, thereby reducing the force per unit area that acts on the conductive bulk layer, and hence reducing risks of damage to the active components underlying the bulk layer.

It would be also appreciated that the conductive bulk layer is made of copper and has Vickers hardness of approximately 30, which is sufficiently soft to absorb the external load during the bonding, thereby further preventing damage to the underlying active components.

Also, the fact that the top layer of the lead wire is made of a material which is wettable with a bump material, so that the bump is allowed to be mounted firmly on the secondary pad.

Since the conductive bulk layer of the lead wire is covered with the hard layer, electromigration of the bulk layer is reduced, thereby enhancing the reliability of the semiconductor device. The reduction of the electromigration is even more enhanced by covering, in addition to the top surface, at least part of the sides of the conductive bulk layer with the same hard metallic layer as the top layer.

In a further aspect of the invention, there is provided a semiconductor device having an area array bump structure capable of reducing connection failures encountered in conventional bump structures as discussed above.

The semiconductor device of the invention is provided with a mechanically weak portion in each solder bump 34 of the area array bump structure such that external stresses concentrate at the portion.

Recalling that each through-hole 35 formed in an insulation substrate 32 receives therein the solder bump 34, the mechanically weak portion may be formed in the solder bump 34 by minimizing, for example, the inner diameter of the through-hole 35 at its mouth section (which is, in the example shown in FIG. 7, the lower end of the insulation substrate 32).

The diametrically smallest section of the through-hole 35 may be formed by tapering the inner wall of the through-hole 35 such that the inner diameter decreases towards the mouth.

The solder bump structure may be alternatively formed by applying a force to the mouth section of the through-hole 35 so that the diameter of the mouth section is reduced, before the solder bump 34 is formed in the through-hole 35.

A diametrically small section may be alternatively formed at the middle section of the through-hole 35 in the insulation substrate 32.

Since the semiconductor device constructed in this manner has a diametrically small section within each through-hole 35 in the insulation substrate 32, the solder bump 34 formed therein is mechanically weaker at the constricted portion. Consequently, when an external stress is applied to the semiconductor device or to the printed circuit board on which the semiconductor device is mounted, the stress will be concentrated at the mechanically weak portion, causing the weak portion to be deformed to absorb the stress, thereby preventing the exfoliation of the solder bump 34 and the bump land 33. Thus, connection failures as discussed above can be reduced.

BRIEF DESCRIPTION OF THE DRAWINGS

Preferred embodiments of the invention will now be described in conjunction with the accompanying drawings, in which FIGS. 1 through 5 illustrate a first group of examples of the invention, while FIGS. 6 through 10 illustrate a second group of examples, and more particularly:

FIG. 2 is an enlarged view of part of FIG. 1B, showing in greater detail the structure of a lead wire;

FIG. 7 shows an example of a semiconductor device of the invention, and more particularly

FIG. 9 shows another example of a semiconductor device of the invention, and more particularly

FIG. 10 shows a further example of a semiconductor device of the invention, and more particularly

DETAILED DESCRIPTION OF THE PREFERRED EMBODIMENT

The invention will be now described in detail by way of example with reference to the accompanying drawings for the first and the second groups of semiconductor devices embodying the first and the second mode of the invention.

[FIRST GROUP OF EXAMPLES]

(First Example)

Figure 1A:
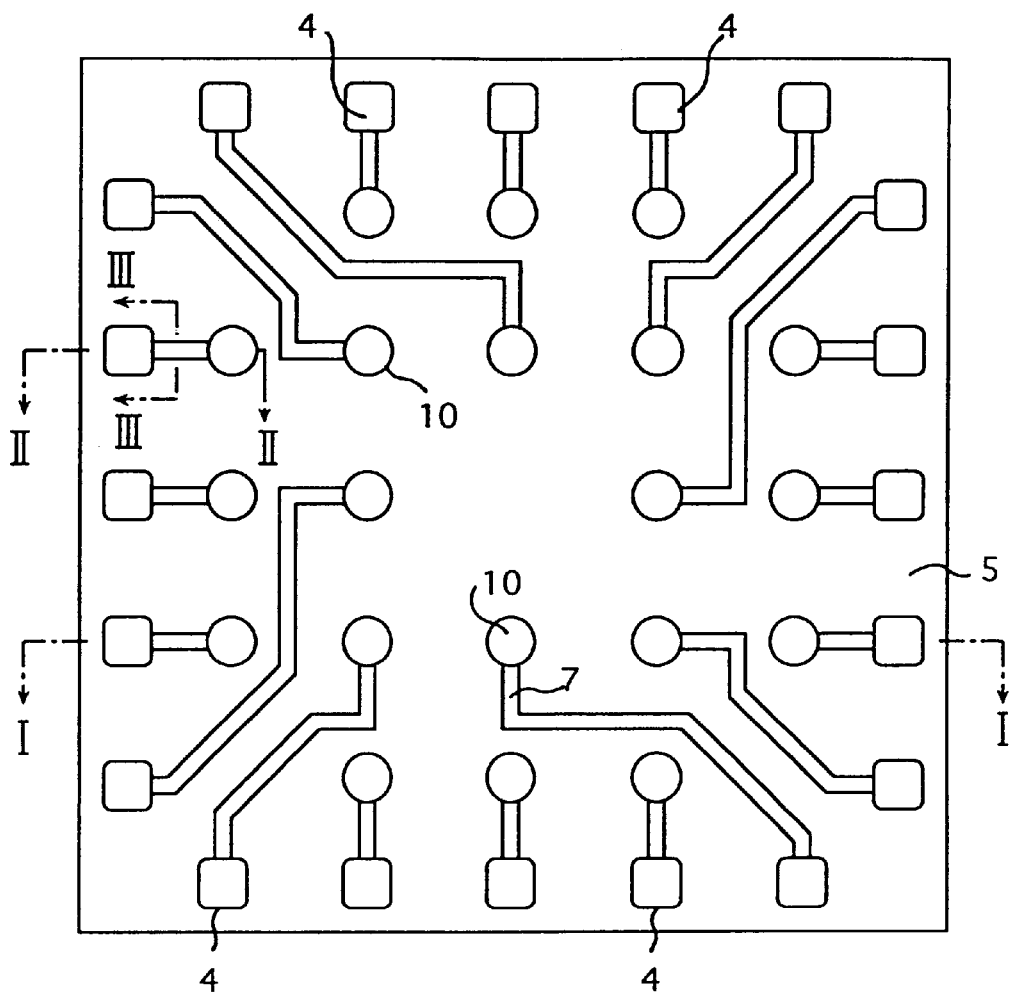
FIG. 1A is a plan view of a semiconductor device according to the invention, with the top protective insulation substrate thereof removed for clarity of illustration.
Figure 1B:
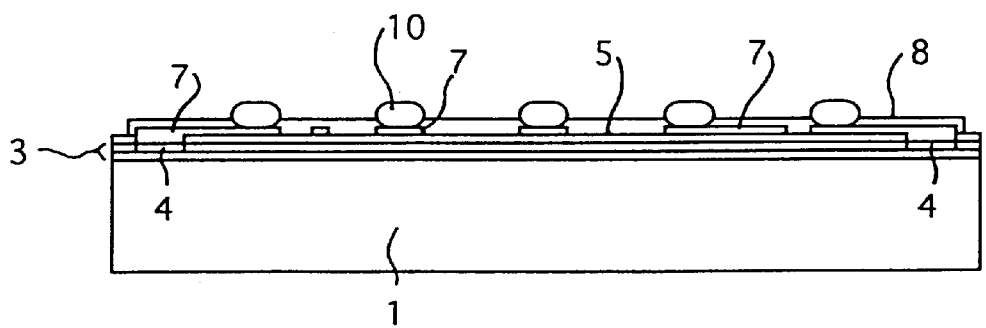
FIG. 1B is a cross section of the device taken along the line 1—1 of FIG. 1A.

FIG. 1A shows a plan view of a semiconductor device provided with secondary pads according to the invention, and FIG. 1B shows the cross section of such semiconductor device taken along the line I—I of FIG. 1A.

Figure 2:
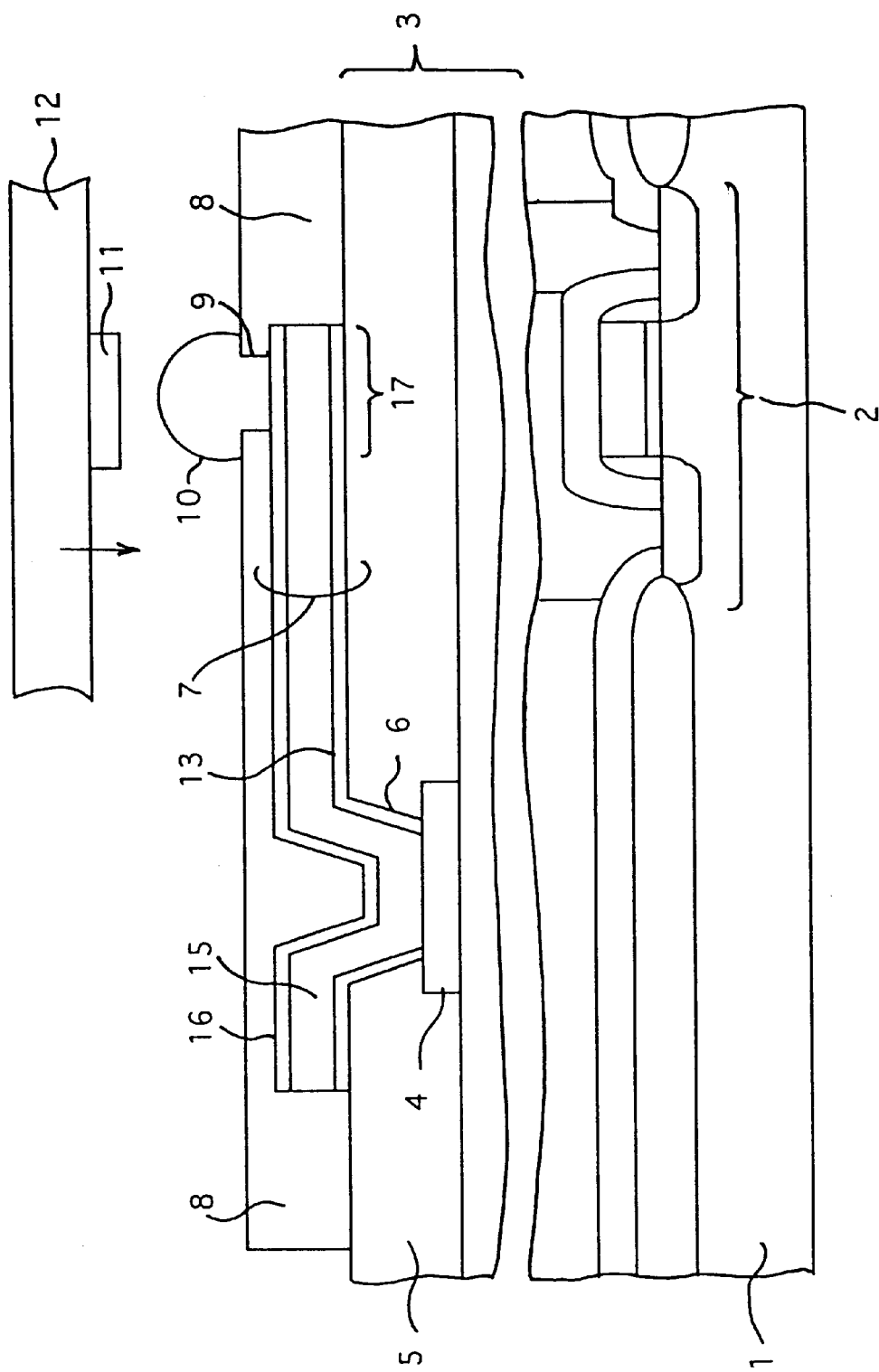

As seen in the figures, a multi-layered lead structure 3 is formed on a semiconductor substrate 1, for electrical connection of semiconductor circuit elements 2 (FIG. 2). The substrate may be silicon or a compound semiconductor. Formed on the multi-layered lead structure 3 is a plurality of primary pads 4 which are spaced apart from one another and connected with the multi-layered lead structure 3. Also formed on the multi-layered lead structure 3 is a first protective insulation substrate 5.

The protective insulation substrate 5 is provided with a set of first openings 6 (FIG. 2) for exposing the pads 4. These pads 4 may be used in packaging the semiconductor device when a suitable packaging technique is available. The semiconductor device may be packaged by another packaging technique using additional or secondary pads of the invention, as described below.

In order to allow for another packaging technique, a different pad arrangement other than the primary one is needed. In the example shown herein, the first protective insulation substrate 5 is provided on the surface thereof with a plurality of elongated insulated lead wires 7. Each of the lead wires 7 is connected at one end thereof to a corresponding one of the primary pads 4 through the first opening 6 associated with the pad 4, and extends to a site (secondary pad site) in the region of the first protective insulation substrate 5 surrounding the opening 6, detouring other lead wires. The lead wire 7 terminates at the secondary pad site.

The lead wires 7 are covered with a second protective insulation substrate 8, except at the secondary pad sites, where the top surfaces of the secondary pads are exposed in a set of second openings 9 of the second protective insulation substrate 8, as shown in FIGS. 1B and 2. The exposed ends of the lead wires 7 at the secondary pad sites serve as secondary pads 17 for the semiconductor device. There is provided on top of each secondary pad, within the second opening 9, a pedestal or bump 10. The bump 10 has a protruding section above the second protective layer. The protruding section is larger in cross section when viewed from above than the opening 9, so that the bonding load per unit area applied to the bump may be reduced.

Referring to FIG. 2, there is shown a film carrier above the bump 10. The film carrier is composed of lead wires 11 and an insulating sheet 12 for carrying the lead wires 11. It is also shown in the figure that the lead wire 7 has a first metallic layer 13, a second metallic layer (or conductive bulk layer) 15, and a third metallic layer 16 on top of the second metallic layer 15. The bump 10 is disposed on the secondary pad 17.

The lead wires 7, the second protective insulation substrate 8, the second openings 9, and the bumps 10 may be fabricated in the following steps.

FIGS. 3A–3H are longitudinal cross sections taken along the line II—II of FIG. 1 and corresponding transverse cross sections taken along the line III—III of FIG. 1, showing various stages of the fabrication of secondary pads.

Figure 3A:
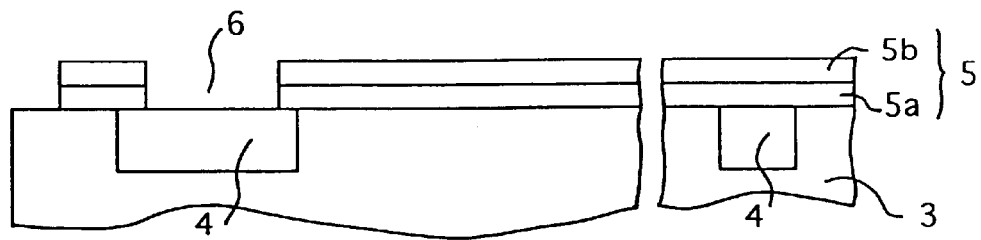
FIGS. 3A through 3H collectively show a first method for forming secondary pads according to the invention.

First, given a semiconductor substrate 1 (FIG. 2) having a plurality of primary pads 4 embedded in a multi-layered connecting structure 3 made of aluminum, an inorganic passivation layer 5a is formed on top of the multi-layered connecting structure 3 to the thickness of approximately 1 micrometer, as shown in FIG. 3A. The passivation layer 5a is made of an inorganic compound such as $Si_3N_4$, $SiO_2$, and PSG (Phospho-Silicate Glass). A second passivation layer 5b made of an organic compound such as polyimides is further formed on top of the passivation layer 5a to the thickness of approximately 2 micrometers. The first and/or the second passivation layer(s) serve(s) as the first protective insulation substrate 5 shown in FIGS. 1B and 2.

Then, applying a known patterning technique, first generally rectangular openings 6 are etched in the organic and inorganic passivation layers 5a and 5b, respectively, above respective pads 4. The dimensions of the openings 6 are chosen, for example, in the range of about 70 micrometers× 80 micrometers.

At this stage the pads 4 of the semiconductor devices may be wirebonded to external lead wires. Subsequent steps described below constitute procedures for forming the secondary pads according to the invention.

Figure 3B:
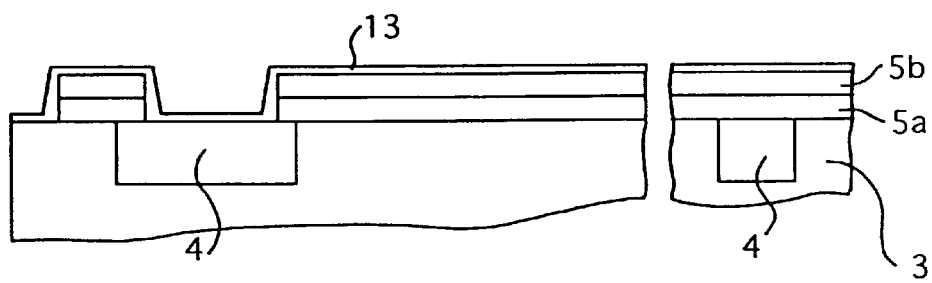

Following the formation of the first openings 6, a first metallic layer 13 is sputtered or evaporated to cover the first openings 6 and the organic passivation layer 5b, as shown in FIG. 3B. The metallic layer 13 can be either mono-layer or multi-layered, and can be made of any material so long as it exhibits good adhesion to the organic passivation layer 5b to prevent the metallic layer from coming off the organic passivation layer 5b. Examples of such adhesive materials for this purpose are titanium (Ti), chromium (Cr), molybdenum (Mo), Tungsten (W) and an alloy that contains any of these metals. When a multi-layered passivation layer 5b is desired, it may include a Cr film having a thickness ranging from about 150 to 500 nanometers and a copper film having a thickness ranging from about 300 to 800 nanometers.

Figure 3C:
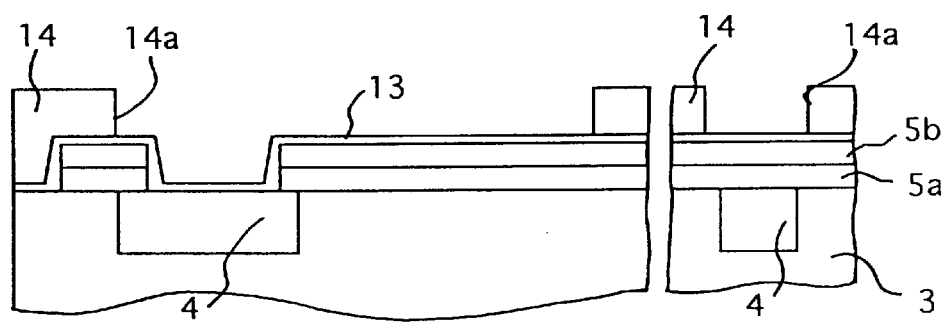

Subsequent to this step, a coat of resist 14 is applied onto the surface of the first metallic layer 13, which resist is then exposed to light and developed to form elongate windows 14a extending on the first layer 13 and over the openings 6 such that metallic layers that will be subsequently deposited in the windows will form the lead wires 7 (FIG. 1A), as shown in FIG. 3C. It should be understood that the windows are located above and adjacent the openings (6) in the first organic and the second inorganic passivation layers 5a and 5b, respectively, and hence the sizes of the windows 14a are larger than the corresponding openings (6).

Figure 3D:
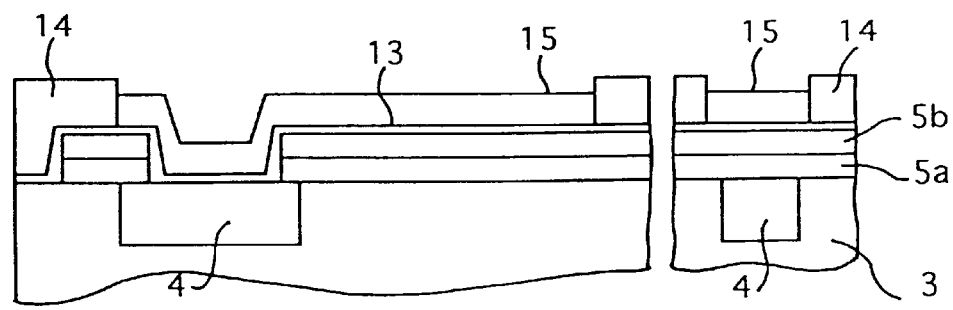

Subsequently, as shown in FIG. 3D, a second metallic layer 15 is formed on the first metallic layers 13 such that the thickness of the second metallic layer 15 ranges from 300 to 800 nanometers and the length thereof ranges from about 2 to 4 micrometers in the windows 14a. This may be achieved by such technique as electroplating, electroless (non-electric) plating, sputtering, and evaporation. Metals having a high conductivity such as copper, silver, nickel and the like are good candidates for the second metallic layer 15. When the second metallic layer 15 is made of copper, it is advantageous to make the first metallic layer 13 multi-layered with its top layer being copper so as to enhance adhesion with the second metallic layer.

Figure 3E:
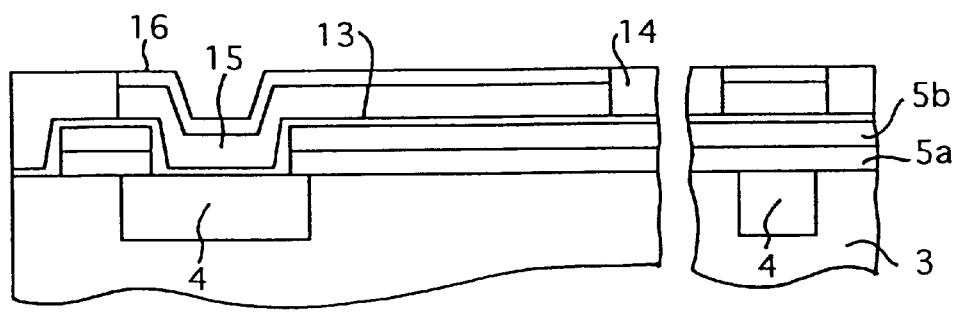

Next, as shown in FIG. 3E, a third metallic layer 16 is formed on the second metallic layer 15 to a thickness of about 0.5 to 3.0 micrometers by the same technique as for the second metallic layer 15. The third metallic layer 16 may be formed of any metal having Vickers hardness greater than 70 such as palladium (Pd), platinum (Pt), Rhodium (Rh) and alloys that contain at least one of these metals. Examples of such alloys are nickel alloys, cobalt alloys, copper alloys and gold alloys.

Figure 3F:
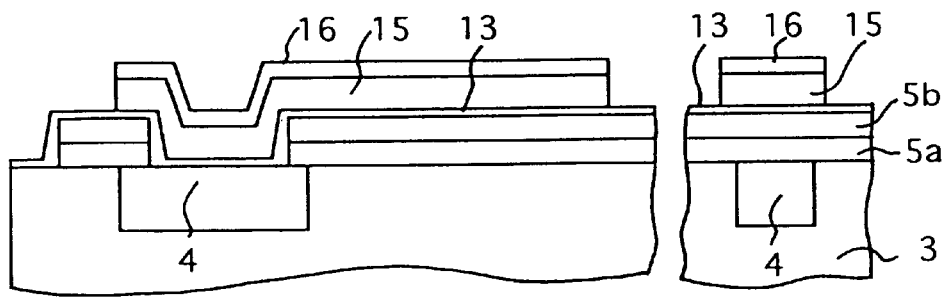

After the resist 14 is removed by a suitable solvent, the semiconductor device has a configuration as shown in FIG. 3F. That is, the second and the third metallic layers 15 and 16, respectively, remaining on the first metallic layer 13 in each window retain the same configuration as the window 14a, since, when the second and the third metallic layer 15 and 16, respectively, are formed by sputtering or evaporation, these layers are lift-off only in the windows 14a and remain there as they are even after the removal of the resist.

Figure 3G:
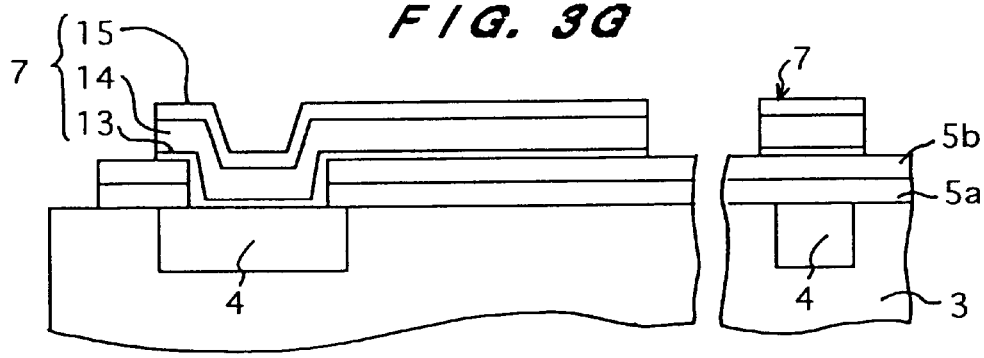

The second and the third metallic layers 15 and 16, respectively, are used as masks to remove the first metallic layer 13 by either acid or alkali base etchant, as shown in FIG. 3G. This process causes the first, the second, and the third metallic layers 13, 15, and 16, respectively, to have the same planar pattern. A set of the metallic layers 13, 15, and 16 constitutes a lead wire 7 shown in FIGS. 1 and 2.

Thereafter, the second protective insulation substrate 8 is formed on the resultant surface. The layer 8 has a plurality of second openings 9 configured to expose terminal sections of the lead wires 7. The terminal sections 17 of the lead wires that are exposed in the second openings 9 are intended to be the secondary pads 17, as described before.

Basically, the foregoing processes complete the formation of the secondary pads. However, an additional process is needed for provision of bumps on the secondary pads 17 when the secondary pads 17 must be TABed with external lead wires 11. Normally, the bumps 10 of PbSn are soldered on the pads 17, as shown in FIG. 2. It should be appreciated that, since the exposed top surfaces of the lead wires 7, that is, the third metallic layers 16, are made of Pd, Pt, or Ro, the PbSn bumps 10 are wettable well to the lead wires 7, thereby adhering well to the lead wires 7.

Since the secondary pads 17 are formed above the active regions of the semiconductor device in the foregoing procedures, it may be suspected that a large bonding load is applied to a secondary pad 17 during bonding an external lead 11 to the bump 10 on the pad 17 or during bonding a wire (not shown) directly to the pad 17, and that the load could be transmitted to the underlying semiconductor circuit element 2.

However, because of the structure of the lead wire 7 for the secondary pad 17, the bonding load may be reduced to a level not harmful to the semiconductor circuit element 2, due to the fact that the third metallic layer 16 has Vickers hardness greater than 70. The hardness of the third hard layer 16 is sufficient to prevent the lead wire 7 from being deformed by the local bonding load and to disperse the load over a wide range of the layer 16, thereby reducing the load per unit area of the third metallic layer 16 to a level not harmful before it is transmitted to the semiconductor circuit element 2.

It would be understood that if the lead wire 7 were entirely made of a soft metal such as copper, the lead wire would be easily deformed by the bonding load applied thereto, since the Vickers hardness of copper is about 30. Such deformation would be transmitted directly to the underlying active region of the semiconductor circuit element 2, thereby causing the semiconductor circuit element 2 to be damaged. However, in the present invention only the second metallic layer 15 of the lead wire is made of copper. It should be appreciated that in this case the second copper layer is even more useful for the reduction of the stress that has been already dispersed by the third hard metallic layer 16 because the copper layer may absorb such dispersed bonding load. Accordingly, the lead wire of the invention may effectively prevent destruction of the underlying semiconductor circuit element 2.

It will be recalled that the third metallic layer 16 is made of a metal that is wettable with the PbSn bump 10, so that the bump 10 has good adhesion to the third layer 16. This is suited for TAB processes.

It will be also recalled that the second metallic layer 15 is made of a metal having a high electric conductivity such as copper, silver, or nickel, so that overall resistance of the lead wire 7 is sufficiently low and will not hurt the performance or circuit characteristics of the semiconductor device when the electric connection is established for the semiconductor circuit element by the lead wire 7.

Figure 4A:
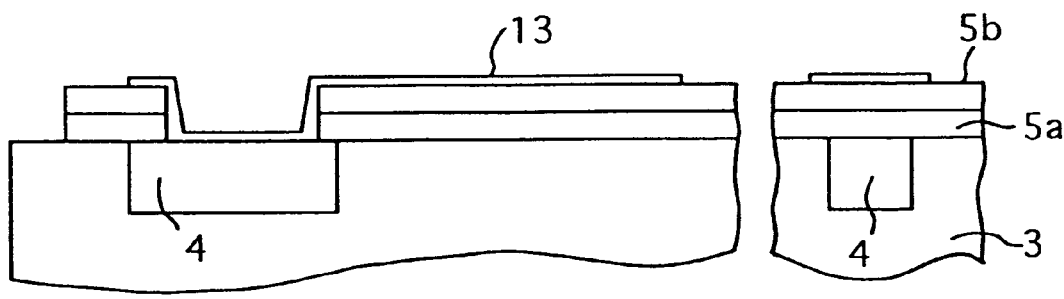
FIGS. 4A through 4C collectively show another method, which is alternative to the first, for forming secondary pads.

Referring now to FIG. 4A, there is shown an example which may substitute for the foregoing example.

In the first example, the first metallic layer 13 is patterned using the second and the third metallic layers 15 and 16, respectively. In contrast, in this alternative approach the first metallic layer 13 is patterned prior to the formation of the second metallic layer 15, as shown in FIG. 4A. In this case, the second and the third metallic layers 15 and 16, respectively, must be formed through electroless plating, sputtering or evaporation technique, since then the first metallic layer 13 cannot be used as an electrode.

Figure 3H:
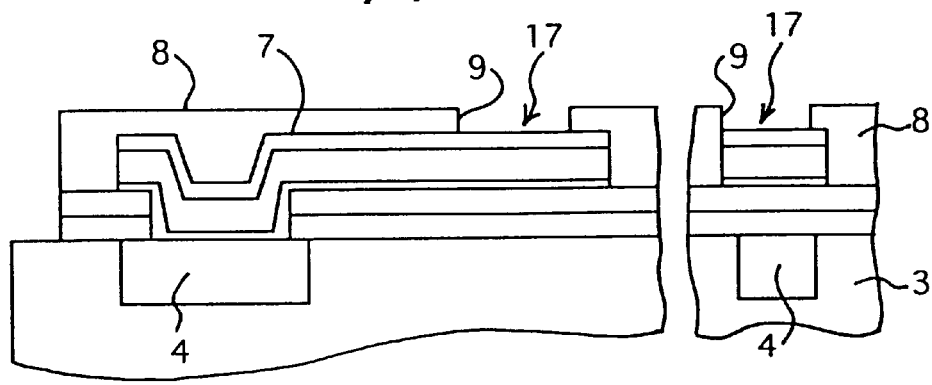
Figure 4B:
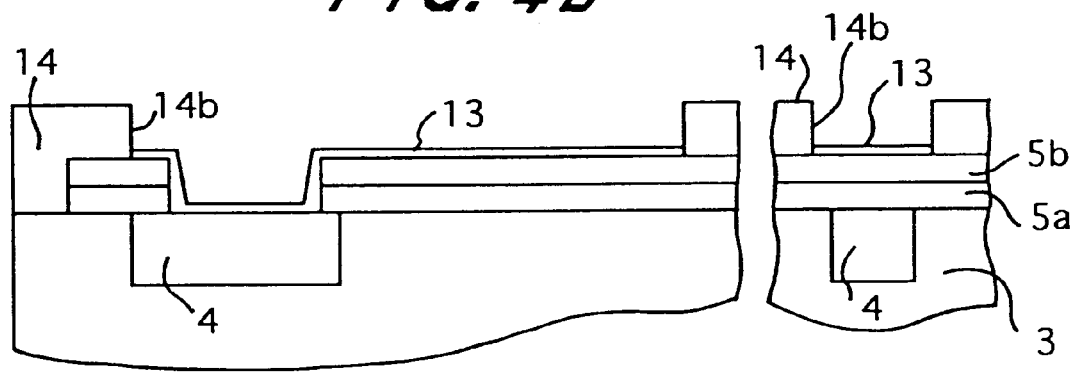
Figure 4C:
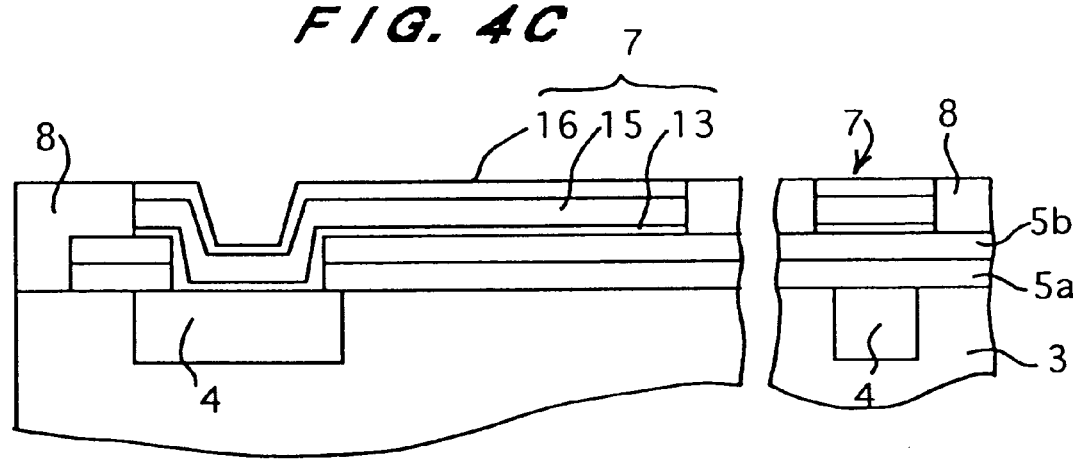

After the first metallic layer 13 has been patterned, the layer is coated with a resist 14, which is then exposed to light and developed to form windows 14b for each pad 4 such that most part of the first layer 13 is exposed inside the opening 14b, as shown in FIG. 4B. Subsequently, the second protective insulation substrate 8 is formed through the steps as described above and depicted in FIGS. 3D through 3H.

It should be understood that either the inorganic passivation layer 5a or the organic passivation layer 5b may be omitted.

(Second Example)

It would be recognized that in the first example described above, the walls defining the window 14a in the resist 14 are substantially perpendicular to the surface of the first protective insulation substrate 5 as shown in FIG. 3C, resulting in the third metallic layer 16 which is substantially the same in configuration as the second metallic layer 15.

However, in the second example of the invention the window 14a may assume a configuration which differs from the configuration of the second and the third layers so that electromigration on the second metallic layer 15 may be suppressed. This may be achieved by the following steps.

First, a window 14a is formed in the resist 14 for each pad 4, as shown in FIG. 3D, and then the second metallic layer 15 is formed in the window 14a by electroplating or an electroless plating technique.

Figure 5A:
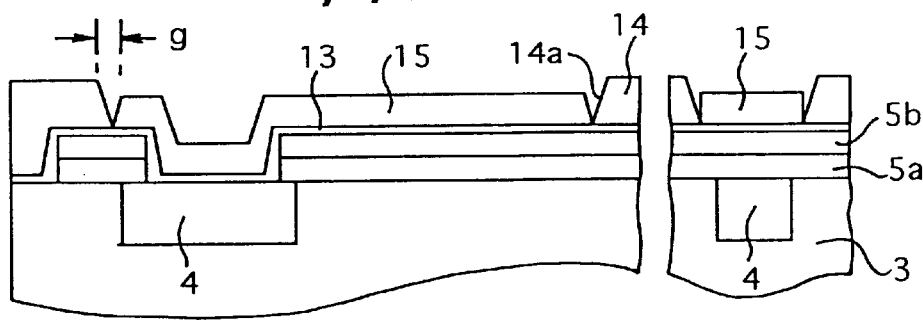
FIGS. 5A through 5D collectively show a second method for forming secondary pads according to the invention.

The resist 14 is then processed so that a gap g is formed within each window 14a and around the second metallic layer 15, as shown in FIG. 5A, with the gap g being at most 2 micrometers long. These gaps may be obtained for example by heating the resist 14 to 150° C. after the second metallic layers 15 have been deposited in the windows 14a by a plating process, thereby causing the resist 14 to shrink. For this purpose, the resist 14 is advantageously employed such as model no. PMER-AR 900 which is commercially available from Tokyo Ohka Kogyo Co. Ltd. and model no. AZ-PLP from Hoechst Japan Ltd. The volume of these resists will somewhat shrink for evaporation of a volatile material from a resist during pre- and post-baking processes at the temperature of 100–110° C.

Figure 5B:
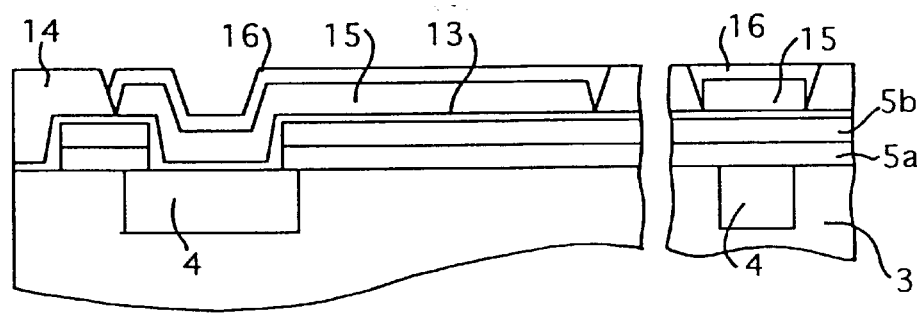

Following this step, the windows 14a, with the gap inclusive, are filled with the third metallic layers 16 by either electroplating, electroless plating, sputtering, or evaporation, as shown in FIG. 5B. As a result, the second metallic layers 15 are covered with the third hard metallic layers 16 not only on the top surfaces but also the sides thereof.

Figure 5C:
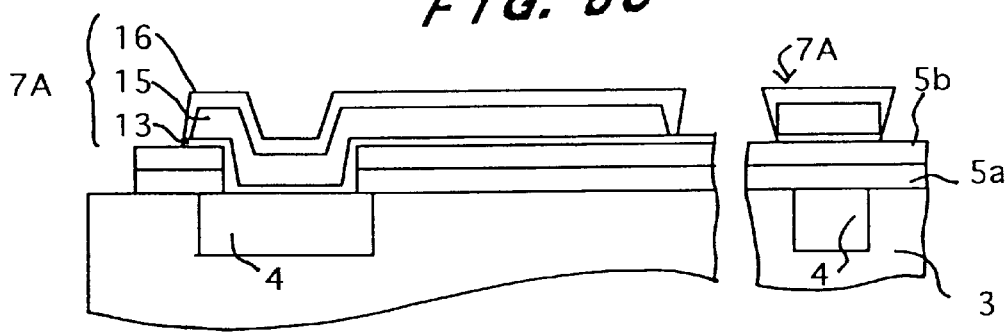

After finishing the formation of the third metallic layer 16 in the window 14a, the resist 14 is removed and the first metallic layer 13 is patterned to construct the lead wire 7A as shown in FIG. 5C, through the steps described in connection with the first example.

Figure 5D:
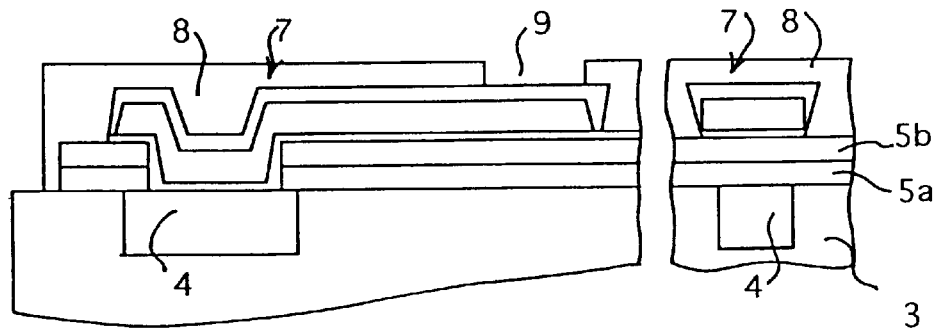

In the next step, the second protective insulation substrate 8 having a second opening 9 is formed, as shown in FIG. 5D.

It should be appreciated that by covering with a highly hard third metallic layer 16 the second metallic layer 15 which has good electric conductivity and Vickers hardness as low as 30, not only electromigration but also stress-migration on the lead wire 7 may be suppressed.

In the case of lead wires configured as shown in FIG. 3H and having inter-lead wire distance of approximately 6 micrometers, occasional shortings due to electromigration were observed in Pressure Cooker Tests (PCT). In contrast, in the case of lead wires having the structure as shown in FIG. 5D and having inter-lead wire distance of not more than 6 micrometers, exhibited no shorting in the same PCTs. In these PCTs, all of the lead wires 7 were composed of first metallic layers 13 of chromium, the second metallic layers 15 of 2 micrometer thick copper, and the third metallic layers 16 of 0.5 micrometer thick palladium, and the second protective insulation substrate 8 was a polyimide.

Thus, the lead wires 7 fabricated through the processes as depicted in the FIGS. 5A through 5D have not only desirable electric properties such as low resistance and decreased electromigration, but also sufficient mechanical strength to protect the underlying semiconductor circuit elements from the bonding loads that arise from bonding external lead wires. In addition, the lead wires 7 have good adhesion to the soldered bumps, thereby increasing the reliability of the semiconductor device.

It can thus be seen that the semiconductor device of the invention, belonging to the first group, has the following advantages:

First, since the top layer of each lead wire for a secondary pad is made of a hard material, the lead wire is not appreciably deformed by the bonding load during TAB or wirebonding of an external lead wire, but instead the hard top layer facilitates dispersion of the load over the top layer. That is, the hard top layer reduces the load per unit area on the layer so as to prevent damage to the underlying active component or semiconductor circuit element.

Second, the load transmitted to the copper bulk layer of the lead wire may be absorbed by the relatively soft bulk layer, so that the stress that would be otherwise transmitted to the underlying active component or semiconductor circuit element, may be diminished.

Third, the top layer of the lead wire, formed by a material that can wet the bump, ensures the bump to be soldered firmly thereon.

Last, by covering the sides of the conductive bulk layer of the lead wire with the same material as the top layer, electromigration beyond the conductive bulk layer may be effectively suppressed, thereby increasing the reliability of the semiconductor device.

[SECOND GROUP OF EXAMPLES]

(Third Example)

Figure 7A:
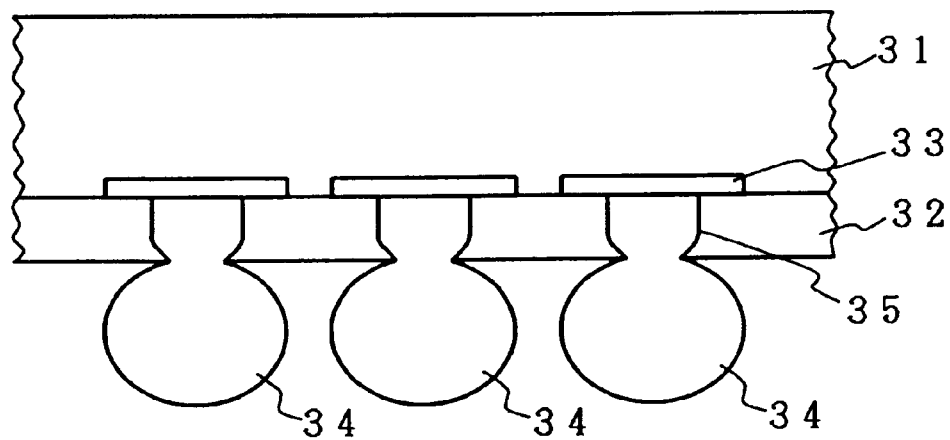
FIG. 7A is a partial cross section of the semiconductor device and FIG. 7B is an enlarged cross section of the device shown in FIG. 7A.
Figure 7B:
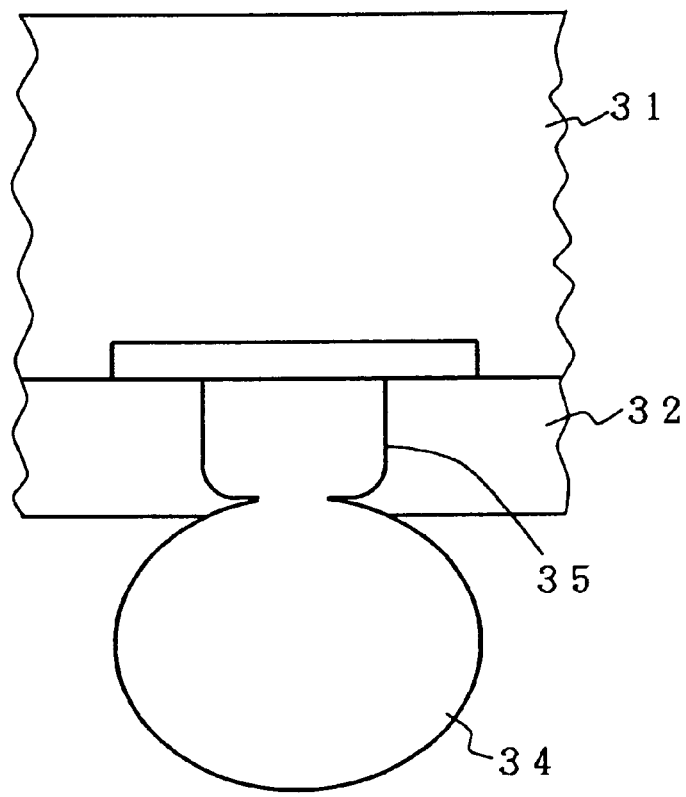

FIG. 7 shows a third semiconductor device of the invention, with FIG. 7A illustrating in cross section a major portion of the device, and FIG. 7B an enlarged cross section of the device shown in FIG. 7A.

Figure 8A:
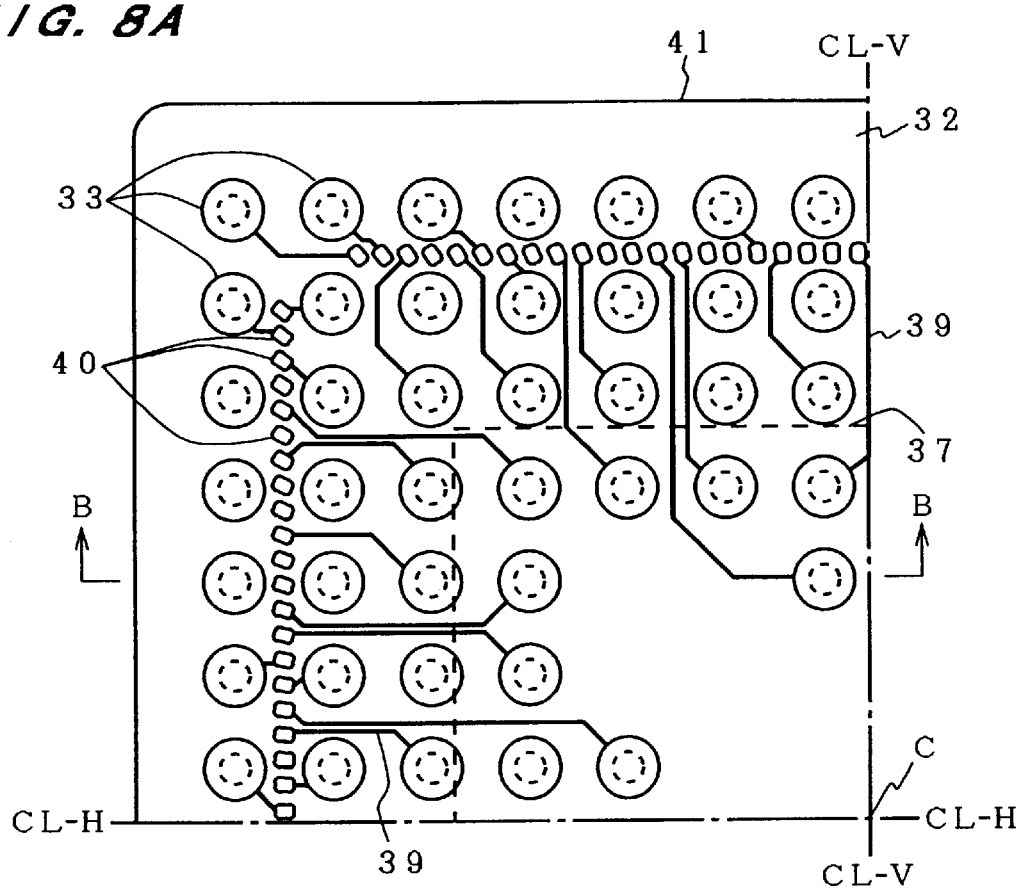
FIG. 8A is a partial plan view of a semiconductor substrate, showing an upper left quarter of the substrate provided with various patterns, with its die glue, LSI chip, sealing resin removed for clarity of illustration.

As shown in these figures, formed on top of an insulation substrate 32, made of a polyimide and the like, are bump lands 33, pads for wire bonding (not shown), and conductive patterns for electrically connecting the wire bonding and the pads. (not shown). Of these elements, bump lands 33 constitute a bump grid array structure which is generally in the form of planar grid on the insulation substrate 32, as shown in FIG. 8A.

Formed on top of the insulation substrate 32 is a layer of sealing material 31 for encapsulating the semiconductor chip (not shown). Although not shown in FIG. 7A, it should be understood, therefore, that semiconductor chips such as ICs and LSIs are secured inside the sealing layer 31 by die glue.

Under each bump-land 33 is an opening or a through-hole 35 having an aperture smaller in diameter than the bump lands 33. Inside each of the through-holes 35 is a solder bump 34, which is bonded with the corresponding bump land 33. In bonding these bumps 34 with the bump lands 33, the insulation substrate 32 is overturned to place the solder bumps 34 in the respective through-holes 35 of the insulation substrate 32. The solder bumps 34 are subjected to solder re-flow treatment.

The third example of invention is characterized in that the inner diameter of the through-holes 35 is not constant throughout the length thereof, that is, along the thickness of the insulation substrate 32, but it is minimum at the mouth (lowest end) of the through-hole 35. This can be made by tapering the inner wall of the through hole 35. Thus, the solder bump 34 in the through-hole 35 is configured to have a constricted portion or mechanically weak portion near the mouth of the through-hole 35. A portion of the solder bump 34 that has over flown out of the through-hole takes a generally semi-spherical shape due to the surface tension of the solder during solidification.

Using this solder bump structure, the semiconductor device is mounted in position on a printed circuit board (not shown) placed underneath the semiconductor device.

The elements of the semiconductor device mentioned above will be further described in detail below. The insulation substrate 32 can be made of any insulation material so long as the through-holes 35 and bump lands 33 may be formed in a manner as described later. For example, a polyimide tape, a polyimide laminate, an FR-4 material in accord with NEMA Standard (which is an flame retardant glass epoxy laminate) may be used for this purpose. In the example shown herein, a polyimide tape having a thickness of about 40–60 micrometers is used.

When the insulation substrate 32 has adequate flexibility, the small diameter section of the through-hole 35 may be formed by locally pressing and deforming the mouth section of the through-hole 35, as described in detail later. A multi-layered insulation substrate consisting of materials having different etching rates and bonded together may be used for the insulation substrate 32. In this case, the tapered through-holes may be formed by etching the substrate in a manner as described in detail later.

The bump lands 33 have predetermined dimensions adequate for the solder bumps 34 which are bonded from the backside of the insulation substrate 32. The bump lands 33 are made of a conductive material having good solderability during the solder re-flow treatment. A typical example of such material is copper (Cu) subjected to a surface treatment for adding solderability.

A sealant 1 is used to protect the semiconductor chips inside thereof from varying conditions and to maintain the reliability of the device. It is made of a material which may hermetically seal the chips. The sealant 1 may be chosen from various known sealing resins and sealing glasses.

The through-holes 35 formed in the insulation substrate 32 each have an inner diameter of about 0.3–0.4 mm at the top end thereof, and about 0.2 mm at the lower end thereof. An adequate method for forming the through-holes 35 may be chosen from those methods involving punching, laser machining, and etching, depending on the material properties of the insulation substrate 32 used.

When a punching method is used to form the tapered through-holes 35 having a minimum diameter at the lower ends thereof as shown in FIG. 8A, a tapered jig may be used.

The solder bumps 34 forming a solder bump structure of the invention are preferably made of an eutectic solder which is fusible at relatively low temperature during the re-flow treatment of the solder bumps.

Referring to FIG. 8A, a method of manufacturing a semiconductor device of the invention will be now described briefly. FIG. 8A shows in plan view a patterned upper left quarter of the semiconductor device. The semiconductor device is also provided with die glue, LSI chips, and a sealing resin, they are not shown in the figure for clarity of illustration. The semiconductor device is symmetric in structure with respect to the horizontal and vertical center lines CL–H and CL–V. For example, the upper left quarter of the device is symmetric with the lower left quarter with respect to the center line CL–H and with upper right quarter with the with respect to the center line CL–V.

A solid line 41 in FIG. 8A represents the outline of the semiconductor device, while a broken line 37 represents the outline of a semiconductor chip in the upper left quarter. A plurality of bump lands 33 are neatly arranged in a region around a semiconductor chip 37 on the insulation substrate 32.

Formed between the bump lands 33 are wire bonding pads 40 at appropriate positions for bonding the bonding wires that extend from the semiconductor chip 37. Conductive patterns 39 are also formed on the insulation substrate 32 to connect the bump lands 33 and the wire bonding pads 40 as needed. It would be understood that the semiconductor chip 37 may be connected by an alternative technique known as a flip-chip bonding. The bump structure used in the example shown herein and the like will be referred to as area array bump structure.

Figure 8B:
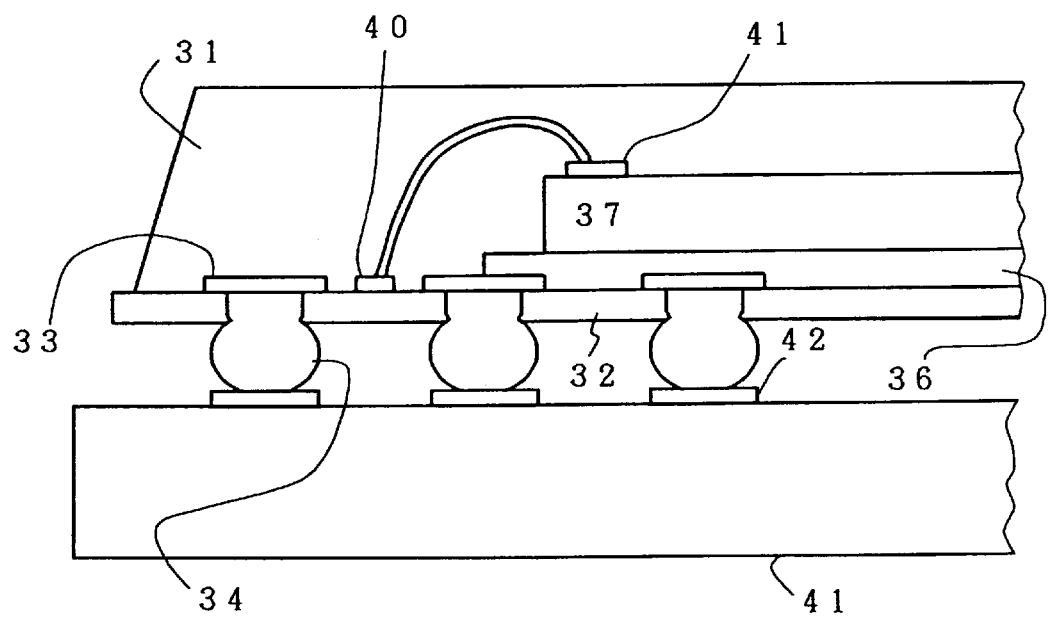
FIG. 8B is a cross section taken along line B—B of FIG. 8A, showing such elements as die glue, LSI chip, and sealing resin on the substrate.

FIG. 8B is a cross section taken along line B—B of FIG. 8A, illustrating explicitly the die glue, LSI chip, and sealing resin abbreviated in FIG. 8A for brevity. A method of manufacturing a semiconductor device using the area array bump structure of the invention is as follows.

First, an insulation substrate 32 of polyimide, for example, is prepared as shown in FIG. 8B, As described above in connection with FIG. 8A, there are formed on top of the insulation substrate 32 typical bump lands 33, wire bonding pads 40 for bonding wires, and conductive patterns 39 for connecting these bump lands and the pads. These patterns may be formed on an ultra thin copper-clad laminate, using a well known lithography technique, which involves etching.

The through-holes 35 may be formed in the insulation substrate 32 at positions corresponding to the bump lands 33 by means of either laser machining, etching, or punching from the backside of the insulation substrate 32. (Note that in the case of punching method, an extremely thin copper foil is applied to the insulation substrate 32 after the insulation substrate 32 is punched, and then the copper foil is patterned.) At this stage, the diameter of each through-hole 35 is uniform throughout the hole. However, instead of the uniform through-holes, it is possible to form tapered through-holes 35 as previously described.

In case the through-holes 35 are not initially tapered, the through holes 35 can be provided with diametrically small sections at the mouths thereof (or the ends of the through holes remote from the bump lands) by pressing the mouths of the through-holes 35 with a suitable means, thereby constricting the mouths of the through holes in the insulation substrate 32. For this purpose, an appropriate pressing jig and a cold press having flat planes may be used.

Solder balls may be mounted on the respective through-holes 35 of the overturned insulation substrate 32. Alternatively, solder paste having a proper thickness may be coated over the respective through-holes 35 by a screen printing technique. Then the insulation substrate 32 and the solder balls or paste may be heated to the melting temperature of the solder for a predetermined period of time, to thereby re-flow the solder into the through-holes 35 to fill the through-holes 35 with the solder. This process is called solder re-flow treatment.

The through-holes 35 thus pressed to have constricted sections maintain the deformed configuration even after the re-flow treatment is finished and also the semiconductor device is mounted on a printed circuit board 41. Consequently, the solder bumps 34 also maintain the same constricted configuration as the through-holes 35.

The LSI chip 37 and other like electronic components are die bonded on top of the insulation substrate 32 using a suitable die glue (or resin). Lead frames 41 of the electronic components are wire bonded to the wire bonding pads 40 on the insulation substrate 32 with bonding wires, as needed.

The bump lands 33, the wire bonding pads 40, the conductive patterns 39, and the semiconductor chip 37 are sealed by the sealing resin 31, which are then heated at the curing temperature of the resin.

The semiconductor device is located in position on the printed circuit board 41, with the solder bumps 34 correctly positioned on the respective bump lands 42 of the printed circuit board 41. The solder bumps are subjected to a further solder re-flow treatment at the melting temperature of the solder, thereby connecting the bump lands 42 with the respective solder bumps 34. As noted previously, configurations of the through-holes 35 will not change through these processes, so that the solder bumps 34 will also maintain the constrictions.

Figure 6A:
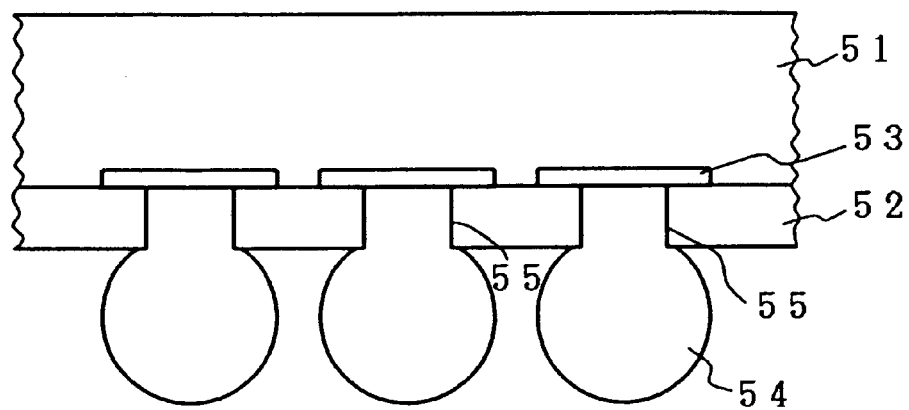
FIG. 6A is a partial cross section of a major portion of conventional solder bump structure for a semiconductor device.
Figure 6B:
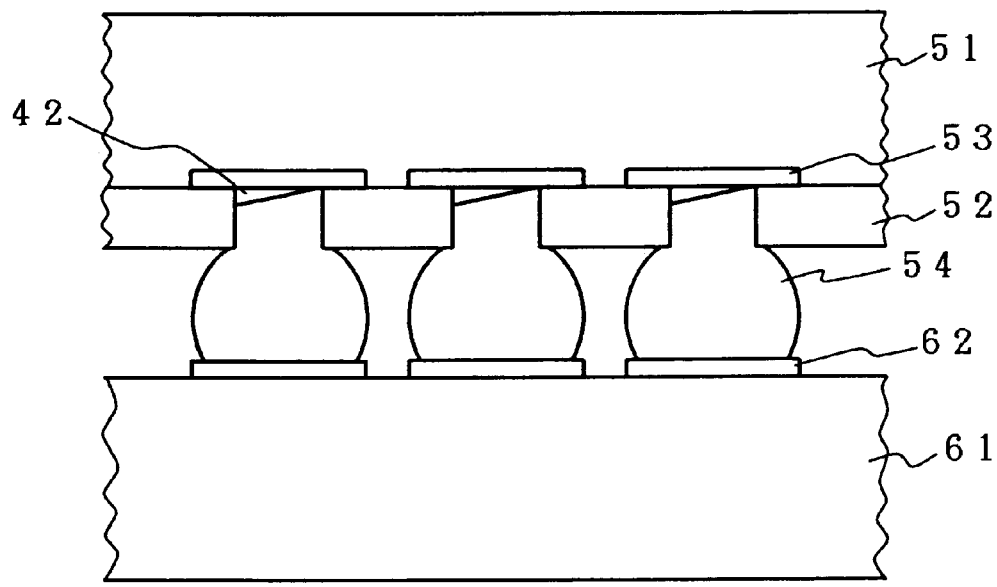
FIG. 6B illustrates a cause of connection error.

With the solder bump structure of the invention, although external stresses applied to the semiconductor device before and after it is mounted on the printed circuit board 41, or external stresses applied to the printed circuit board 41 installed to an electronic device (not shown), can cause a bend and/or twist in the semiconductor device, problematic exfoliation of the bump lands 33 and solder bumps 34 will not occur, since the through-holes 35, and hence the solder bumps 34 also, have a diametrically smallest section at the lowest ends of through-holes 35 formed in the insulation substrate 32, so that the external stresses tend to concentrate at the diametrically smallest sections, thereby causing the stressed solder bumps 34 to be bent or twisted at those sections. As a result of the deformation of the solder, the stresses accumulating in the bonding interface between the bump lands 33 and solder bumps 34 are greatly relieved. Accordingly, unlike conventional bump structures in which exfoliation of the solder bump lands 53 and the solder bumps 54 as described in connection with FIG. 6B can take place, the exfoliation of the bump lands 33 from the solder bumps 34 is greatly reduced in the present invention.

(Fourth Example)

Figure 9A:
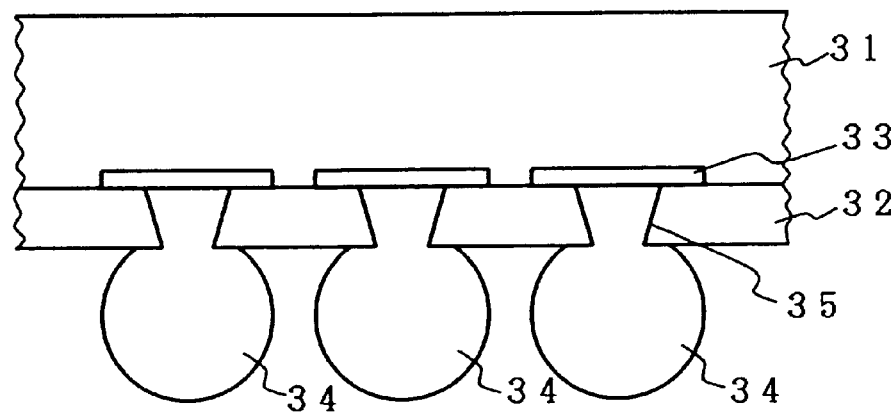
FIG. 9A is a partial cross section of the semiconductor device and FIG. 9B is an enlarged cross section of the device shown in FIG. 9A.
Figure 9B:
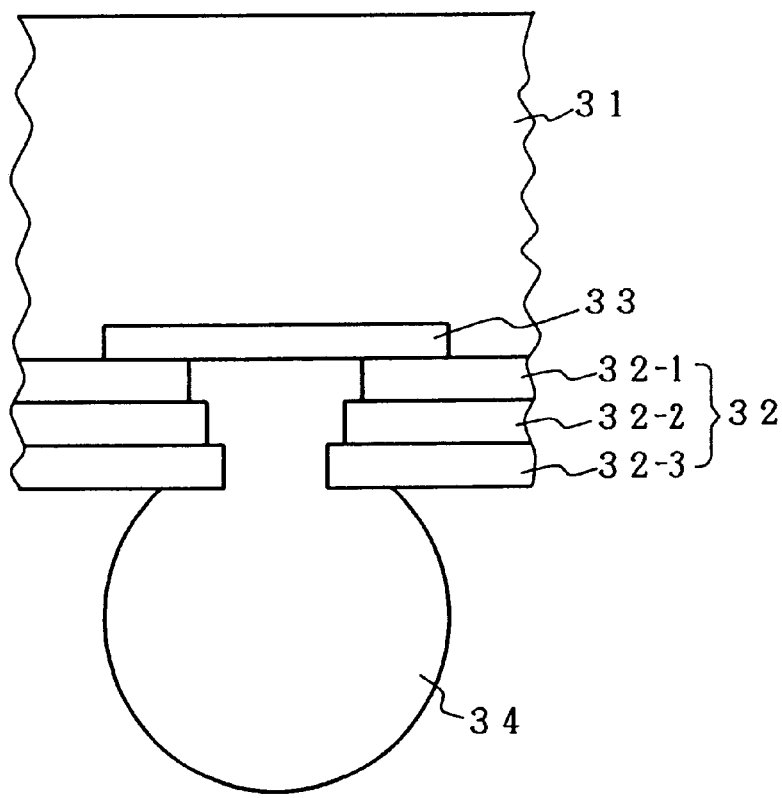

FIG. 9 shows a fourth semiconductor device embodying the invention, and more particularly, FIG. 9A is a cross section of the major portion of the device and FIG. 9B is a partial enlarged cross section of the device shown in FIG. 9A.

Compared with the third example above, the fourth example shown herein has a different configuration for the through-holes 35. More particularly, the through-holes 35 of this example are formed such that the inner diameter thereof decrease gradually from the upper ends towards the lower ends thereof.

This semiconductor device differs from the first example in the manufacturing steps of forming the through-holes 35. First, a plurality of insulation substrates 32 having concentric openings of different diameters are prepared, which are stacked in the order of decreasing diameter of the openings, as shown in FIG. 9B. The stack includes three kinds of insulation substrates: nominal one, 32-2, having a nominal diameter, another, 32-1, having a larger diameter than the nominal one, and a further one, 32-3, having a smaller diameter than the nominal one. The stacked substrate are bonded together with suitable glue or thermocompressionly bonded (ie. thermally bonded under a pressure) together using heat curable plastic.

Alternatively, a stack of insulation substrates 32-1 through 32-3 having a high, an intermediate, and a low etching rates to an etchant, respectively, may be used for the insulation substrate 32. The stacked substrates are bonded together with suitable glue or thermocompressionly bonded together using heat curable plastic. The insulation substrate 32 thus bonded is then etched to form the through-holes 35 having a desired configuration.

Except for the structure and the manufacturing steps as described above, the fourth semiconductor device is the same as the third example.

With the structure of the fourth example, although external stresses applied to the semiconductor device before and after it is mounted on the printed circuit board 41, or external stresses applied to the printed circuit board 41 installed to an electronic equipment (not shown), can cause a bend and/or twist in the semiconductor device, exfoliation of the bump lands 33 and solder bumps 34 will not occur, since the external stresses tend to concentrate at the diametrically smallest sections, thereby causing the stressed solder bumps 34 to be bent or twisted at those sections, so that the stresses accumulating in the bonding interface between the bump lands 33 and solder bumps 34 are greatly relieved.

(Fifth Example)

Figure 10A:
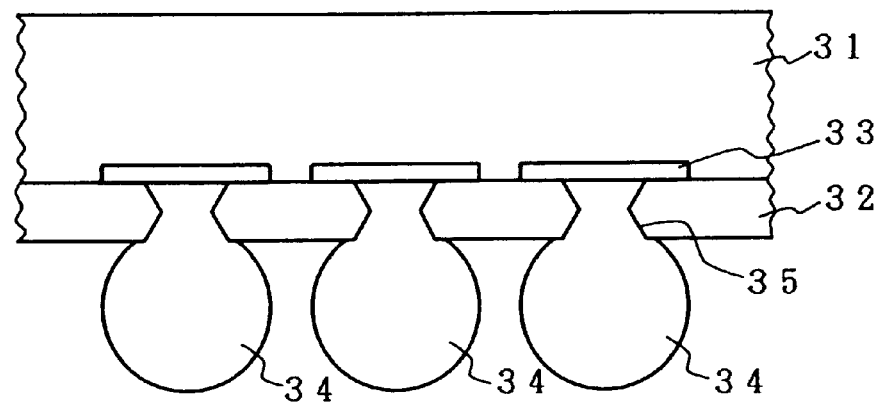
FIG. 10A is a partial cross section of the semiconductor device and FIG. 10B is an enlarged cross section of the device shown in FIG. 10A.

FIG. 10 shows a fifth example of the invention, and more particularly, FIG. 10A shows a cross section of the major portion of device, and FIG. 9B a partial enlarged cross section of the device shown in FIG. 9A.

The fifth semiconductor device of the invention is the same as the third one above except for the configuration of the through-holes 35. In the fifth example, every through-hole 35 formed in the insulation layer has a constricted section at the middle of the through-hole along the thickness of the insulation substrate 32.

Figure 10B:
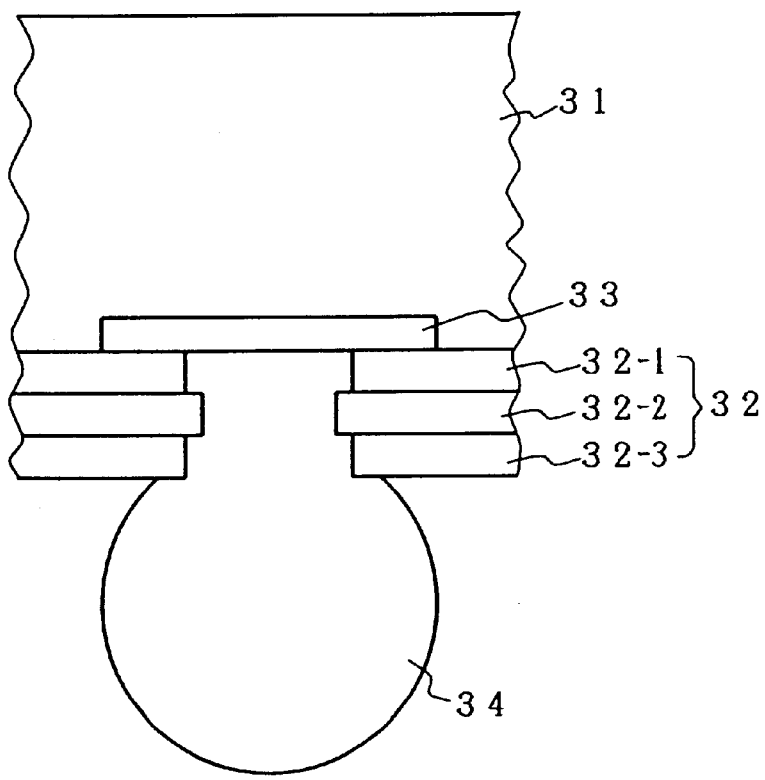

The steps for manufacturing the fifth semiconductor device are the same as the first one, except for the step of forming the through-holes 35. As shown in FIG. 10B, three insulation substrates, 32-1 through 32-3, having prefabricated concentric holes of different diameters are prepared. They are stacked such that the one having the smallest through-hole is placed in the middle of the stack. They are then bonded together with appropriate glue or thermocompressionly bonded together when the insulation layers are made of a thermosetting resin.

Alternatively, three plastic insulation layers, 32-1 through 32-3, having high, a relatively low, and a relatively high etching rates, respectively, are stacked in the order mentioned, and then bonded with glue or thermocompressionly bonded, forming concentric through-holes each having a constricted section in the middle thereof.

The fifth example is the same as the third one in structure and in steps of manufacture thereof, except for the structures of, and the steps of manufacturing, the through-holes.

With the structure of the fifth example, although external stresses applied to the semiconductor device before and after it is mounted on the printed circuit board 41, or external stresses applied to the printed circuit board 41 installed to an electronic equipment (not shown), can cause a bend and/or twist in the semiconductor device, exfoliation of the bump lands 33 and solder bumps 34 will not occur, since the external stresses tend to concentrate at the diametrically smallest sections, thereby causing the stressed solder bumps 34 to be bent or twisted at those sections, so that the stresses accumulating in the bonding interface between the bump lands 33 and solder bumps 34 are greatly relieved.

As exemplified by the second group of semiconductor devices (Examples 3–5), the invention may provide a semiconductor device having an area array bump structure which is capable of reducing connection failures encountered in connection with packaging of the semiconductor device.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the intention is to cover all modifications, equivalents, and alternatives falling within the spirit and scope of the invention as defined by the appended claims.

What we claim is:

1. A method for manufacturing a semiconductor device, comprising steps of:

forming first conductive pads in a region above and surrounding a semiconductor circuit element made on a semiconductor substrate forming a first protective insulating layer covering said first conductive pads;

forming first openings in said first protective insulating layer and on said first conductive pads respectively;

forming a resist having windows in the form of elongate groove extending from said first openings respectively to an inner region surrounded by said first openings;

forming within said each of said windows a conductive bulk layer as a lead wire connected at one end thereof to each of said first conductive pads through each of said first openings;

forming a metallic layer of a hard metal on each of said conductive bulk layer, said hard metal being harder than said conductive bulk layer;

removing said resist;

forming a second protective insulating layer for covering said first protective insulating layer and said lead wire; and forming second openings in said second protective insulating layer, for exposing the top surface of the other end of said lead wire as a second conductive pad.

2. The method for manufacturing a semiconductor device according to claim 1, wherein said conductive bulk layer of said lead wire is copper.

3. The method for manufacturing a semiconductor device according to claim 1, wherein said first protective insulating layer is formed by steps of forming an inorganic passivation layer for covering said first pads and forming an organic passivation layer on top of said inorganic passivation layer.

4. The method for manufacturing a semiconductor device according to claim 3, wherein said inorganic passivation layer is made of either $Si_3N_4$, $SiO_2$ or PSG; and said organic passivation layer is polyimide.

5. The method for manufacturing a semiconductor device according to claim 1, further comprising steps of, in advance of formation of said resist, forming a first metallic layer having good adhesion to said organic passivation layer; and after removing said resist, etching said first metallic layer exposed from said lead wire.

6. The method for manufacturing a semiconductor device according to claim 5, wherein said first metallic layer is a mono-layer of either titanium, chromium, molibudenum, tungsten, or an alloy containing one of these metals.

7. The method for manufacturing a semiconductor device according to claim 5, wherein said conductive bulk layer is a multi-layer of chromium and copper.

8. The method for manufacturing a semiconductor device according to claim 1, wherein said hard metal layer is either palladium, platinum, rhodium, or an alloy containing one of these metals.

9. A method for manufacturing a semiconductor device, comprising steps of:

forming first conductive pads in a region above and surrounding a semiconductor circuit element made on a semiconductor substrate;

forming a first protective insulating layer covering said first conductive pads;

forming first openings on said first conductive pads respectively and in said first insulating layer;

forming a resist having windows in the form of elongate groove extending from said first openings respectively to an inner region surround by said first openings;

forming within said windows a bulk copper layer as a lead wire connected at one end thereof to each of said first conductive pads through said openings respectively;

forming a gap between said resist and each of said conductive bulk copper layer;

forming a top metallic layer containing either palladium, platinum, rhodium or an alloy containing one of these metals on a top surface and side surfaces of said conductive bulk layer copper layer within each of said windows, as an upper part of said lead wire;

removing said resist;

forming a second protective insulating layer for covering said first protective insulating layer and said lead wires; and forming second openings in said second protective insulating layer, for exposing a top surface of the other end of said lead wire as a second conductive pad.

10. The method for manufacturing a semiconductor according to claim 9, wherein said gap is formed by heating said resist causing said resist to shrink.

11. The method for manufacturing a semiconductor device according to claim 1, wherein a Vickers hardness of said hard metal is greater than 70.

* * * * *